United States Patent
Shoda et al.

[11] Patent Number: 5,950,099
[45] Date of Patent: *Sep. 7, 1999

[54] METHOD OF FORMING AN INTERCONNECT

[75] Inventors: Naohiro Shoda, Wappingers Falls; Katsuya Okumura, Poughkeepsie, both of N.Y.

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/629,442

[22] Filed: Apr. 9, 1996

[51] Int. Cl.⁶ .......................... H01L 21/265; H01L 21/28
[52] U.S. Cl. .......................... 438/533; 438/637; 438/639; 438/647; 438/648; 438/657; 438/675
[58] Field of Search ........................ 437/189, 192, 437/193, 195, 200, 228 ST; 438/637, 639, 641, 647, 648, 656, 657, 675, 677, 514, 515, 532, 533, 592

[56] References Cited

U.S. PATENT DOCUMENTS

| | | |
|---|---|---|
| 4,532,702 | 8/1985 | Gigante et al. . |
| 4,764,484 | 8/1988 | Mo .......................... 437/203 |
| 4,801,559 | 1/1989 | Imaoka ...................... 437/193 |
| 4,902,645 | 2/1990 | Ohba ........................ 437/200 |
| 4,948,755 | 8/1990 | Mo .......................... 437/195 |
| 4,983,543 | 1/1991 | Sato et al. ................. 437/192 |
| 4,987,099 | 1/1991 | Flanner ..................... 437/192 |
| 5,006,484 | 4/1991 | Harada ...................... 437/192 |
| 5,023,201 | 6/1991 | Stanasolovich et al. ......... 437/192 |
| 5,048,418 | 9/1991 | Esquivel et al. .............. 437/203 |
| 5,066,612 | 11/1991 | Ohba et al. ................. 437/192 |
| 5,087,322 | 2/1992 | Lillienfeld et al. ........... 156/628 |
| 5,122,479 | 6/1992 | Audet et al. . |
| 5,187,120 | 2/1993 | Wang . |
| 5,192,713 | 3/1993 | Harada . |
| 5,210,053 | 5/1993 | Yamagata . |
| 5,211,987 | 5/1993 | Kunishima et al. . |
| 5,223,081 | 6/1993 | Doan ........................ 156/628 |
| 5,280,190 | 1/1994 | Lu . |
| 5,314,841 | 5/1994 | Brady et al. . |
| 5,354,712 | 10/1994 | Ho et al. ................... 437/195 |
| 5,426,330 | 6/1995 | Joshi et al. . |
| 5,482,882 | 1/1996 | Lur et al. ................... 437/52 |

OTHER PUBLICATIONS

Wolf, S., et al., Silicon Processing, vol. 1, 1986, pp. 175–182, Lattice Press.

Primary Examiner—T. N. Quach
Attorney, Agent, or Firm—Banner & Witcoff, Ltd.

[57] ABSTRACT

A method for fabricating a damascene interconnect includes the steps of depositing a metal layer of the surface of an insulating film; etching the metal layer and the insulating film to form an insulating groove; depositing a silicon layer on an upper surface on the metal layer and on each sidewall and a bottom of the insulating groove; annealing the silicon layer and the metal layer to form a silicide layer; implanting ions in the bottom of the insulating groove; and depositing an interconnect material in the insulating groove using selective chemical vapor deposition. In one embodiment, the metal layer is a titanium layer, the interconnect material is tungsten, and the implanted ions are arsenic ions.

23 Claims, 4 Drawing Sheets

METHOD OF FORMING AN INTERCONNECT

FIELD OF THE INVENTION

The present invention relates to the fabrication of a tungsten interconnect in a groove formed in an insulator film of a semiconductor device. More specifically, the present invention relates to the fabrication of a damascene interconnect using selective chemical vapor deposition.

BACKGROUND OF THE INVENTION

The formation of a damascene interconnect in a groove formed in an insulating film requires that conductive material be deposited only within the insulator groove. Therefore, precise manufacturing steps are required to ensure that the interconnect is formed only within the groove and does not overflow onto the surface of the insulating film in which the insulator groove is formed.

Fabrication of damascene interconnects is currently accomplished using a physical vapor deposition (PVD) process for depositing tungsten followed by a chemical mechanical polishing (CMP) process as illustrated in prior art FIG. 1. In FIG. 1A, a groove 110 is formed in a silicon dioxide or other insulating layer 100 by photoresist patterning followed by reactive ion etching (RIE). A conductor 102 is then deposited using physical vapor deposition (PVD) as shown in FIG. 1B. This conductive layer 102 is then polished using CMP as shown in FIG. 1C. This CMP process causes a residue 103, e.g., $SiO_2$ clusters, to be formed within the groove 110. When tungsten or other interconnect material is subsequently deposited in the groove using a PVD process, this residue inhibits the growth of selectively deposited tungsten from the bottom of the groove 110. Thus, the interconnect material grows more readily from the sidewalls of the groove than from the bottom of the groove, causing the tungsten or other interconnect material to overflow the groove 110. The resulting overfill (shown in FIG. 1D) must be removed using CMP. Because CMP is utilized to remove conductive layer 102, the residue may cause shorts between interconnects. The residue 103 between the tungsten or other interconnect material and the conductor 102 at the bottom of the groove may also cause opening problems.

Other known tungsten interconnect fabrication methods are described in U.S. Pat. Nos. 4,764,484 and 4,948,755; and E. K. Broadbent et al., "High-Density, High-Reliability Tungsten Interconnection by Filled Interconnect Groove Metalization," from IEEE Transactions on Electron Devices, vol. 35 (1988) at page 952. The '484 and '755 patents describe a fabrication process using a thin silicon layer at the bottom of the groove which is consumed during the selective CVD tungsten deposition. However, this fabrication method may result in shorts between interconnects, even when intrinsic silicon is used. Also, tungsten encroachment occurs in the lateral direction during the silicon consumption process, further increasing the short problem. The Broadbent article describes a fabrication process in which blanket CVD tungsten and RIE etchback are used instead of CMP in the formation of a damascene interconnect. However, the non-uniformity of the RIE etchback may create a step between the oxide and the tungsten surface such that the performance of the interconnect is compromised.

Accordingly, it is an object of the present invention to provide a residue-free surface at the bottom of the insulator groove in which a damascene interconnect is to be formed, thereby enabling growth of selectively deposited tungsten (or other material) on the bottom of the groove.

It is another object of the present invention to provide a method of fabricating a damascene interconnect using selective chemical vapor deposition of tungsten (or other interconnect material) instead of physical vapor deposition of the interconnect material such that the deposited tungsten or other interconnect material deposited grows more readily from the bottom of the insulator groove rather than from the sidewalls of the insulator groove, thereby reducing or eliminating the need for CMP and improving the performance of the interconnect.

SUMMARY OF THE INVENTION

In accordance with the present invention, the above-described drawbacks of the conventional interconnect fabrication method are overcome by the use of metal silicide formation and selective etching of the metal silicide.

In the method according to the present invention, metal is deposited on an insulating film. The metal and insulating film are then etched to form an insulator groove. A silicon layer is subsequently deposited and annealed to form a metal silicide. Impurities are implanted into the bottom of the groove to enable growth of the interconnect material (e.g., tungsten). The silicide is then removed, and the interconnect material such as tungsten is deposited using selective CVD. Since the tungsten grows more readily (has a shorter incubation period) on conductive materials (e.g., the doped silicon film at the bottom of the insulating groove) than on non-conductive materials (e.g., the undoped silicon on the sidewalls of the insulating groove), the deposited tungsten tends to grow from the doped silicon at the bottom of the groove rather than from the undoped sidewalls of the groove. This substantially reduces the need for CMP following deposition of the tungsten because the tungsten is less likely to overflow the groove. Also, the conductivity of the doped silicon region improves the performance of the interconnect by reducing the resistance of the silicon film at the bottom of the groove.

A fabrication method according to the present invention includes the steps of depositing a metal layer on the surface of an insulating film; etching the metal layer and the insulating film to form an insulating groove; depositing a silicon layer on an upper surface of the metal layer and on each sidewall and a bottom of the insulating groove; annealing the silicon layer and the metal layer to form a silicide layer; implanting ions in the bottom of the insulating groove; and depositing an interconnect material in the insulating groove using selective chemical vapor deposition. The metal layer may be a titanium layer, the interconnect material may be tungsten, and the implanted ions may be arsenic ions.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

DETAILED DESCRIPTION

The method of fabricating a tungsten interconnect in an insulator groove formed on a silicon substrate will now be described in detail with reference to the accompanying drawings. While the fabrication methods described below pertain to the fabrication of a tungsten interconnect, the method according to the present invention is not limited to the use of tungsten, such that other suitable materials may be substituted without departing from the scope of the present invention.

A method for fabricating a tungsten (or other suitable material) interconnect in an insulator groove according to the present invention is illustrated in FIGS. 2A through 2I.

Figure 1A:
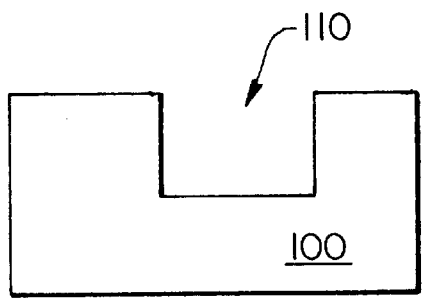
FIGS. 1A through 1D illustrate a prior art method for fabricating a damascene interconnect in an insulator groove.
Figure 1B:
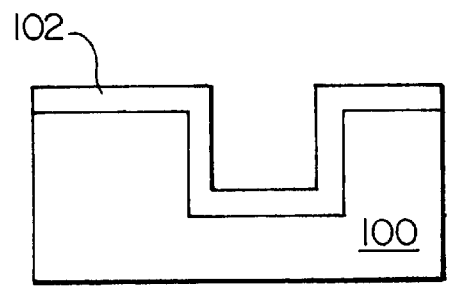
Figure 1C:
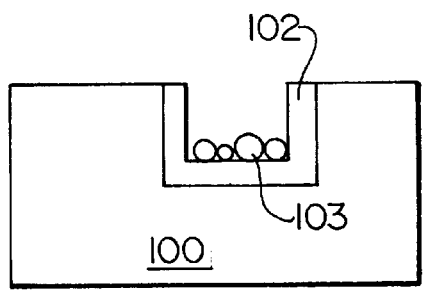
Figure 1D:
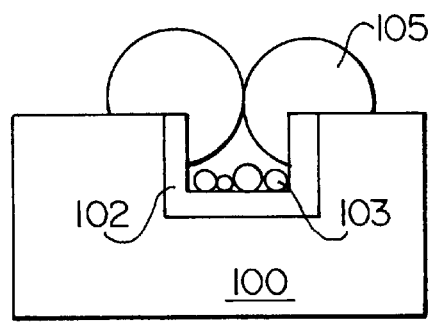
Figure 2A:
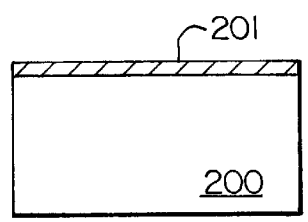
FIGS. 2A through 2I illustrate the sequential steps of a first interconnect fabrication process according to the present invention.

As shown in FIG. 2A, a metal layer 201, for example, a titanium (Ti) layer, is deposited on a silicon dioxide insulating film 200 using a conventional PVD or CVD deposition technique.

Figure 2B:
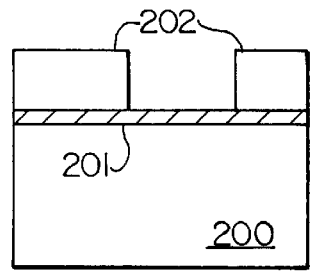
Figure 2C:
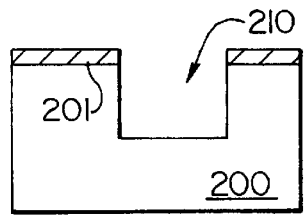

Next, as shown in FIG. 2B, a photoresist 202 is formed on the metal layer 201 and patterned. Then, in FIG. 2C, the metal layer 201 and oxide layer 200 are etched using, for example, a conventional reactive ion etching (RIE) process, to form a groove 210 having straight sidewalls for an interconnect structure. According to one embodiment of the present invention, the groove 210 has a depth of approximately 0.1 to 0.5 micrometers.

Figure 2D:
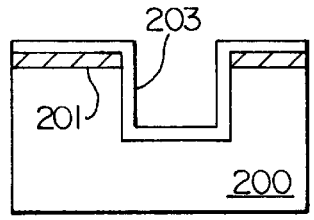

As shown in FIG. 2D, a silicon layer 203 is deposited on the metal layer 201 and within the groove 210 using, for example, a conventional CVD or PVD technique. According to one embodiment of the present invention, this silicon layer has a thickness of approximately 100 to 300 angstroms, and the ratio of thicknesses between the metal layer 201 and the silicon layer 203 is greater than 0.4 ((thickness of metal layer 201)/(thickness of silicon layer) >0.4).

Figure 2E:
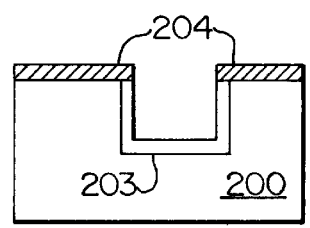

Then, in FIG. 2E, the structure is annealed such that a metal silicide 204, e.g., $TiSi_2$, is formed. During this processing step, the silicon layer 203 is completely consumed. For example, if the metal layer 201 is a Ti layer, a conventional rapid thermal annealing or furnace annealing process at a temperature of 500° to 750° C. may be used to form $TiSi_2$.

Figure 2F:
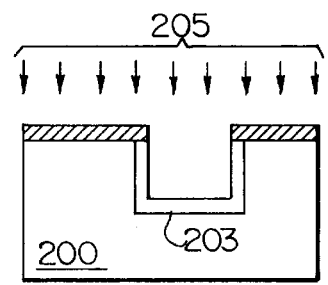
Figure 2G:
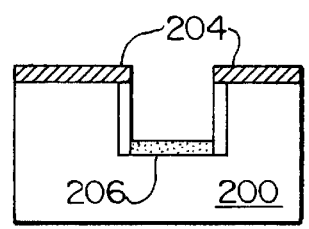

Subsequently, in FIG. 2F, an impurity such as arsenic or phosphorous is implanted as indicated by arrows 205. This forms a high impurity region 206 as shown in FIG. 2G. In a preferred embodiment, N type ions are implanted because the greater number of free electrons results in a shorter incubation time. A conventional implanting process may be used to achieve the necessary full distribution of impurities. For example, a dose of $1E11/cm^2$ to $1E15/cm^2$ and an implant voltage of approximately 10 to 50 keV may be used to achieve an implant having a depth of approximately 200 angstroms.

Figure 2H:
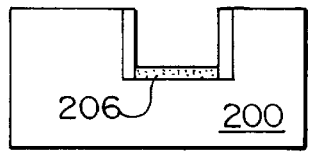

Next, as shown in FIG. 2H, the metal silicide layer 204 is selectively etched using, for example, an HF or buffered HF (e.g., $NH_4F$) solution. The etching solution must be diluted, for example, as shown in the chart below.

| $H_2O:NH_4F$ (ratio) | $TiSi_2$ (etch rate) | Thermal $SiO_2$ (etch rate) | Selectivity (approximate ratio) |
|---|---|---|---|
| 200:1 | 60 Å/min. | 0.75 Å/min. | 80 |
| 100:1 | 160 Å/min. | 2.75 Å/min. | 58 |
| 15:1 | 800 Å/min. | 63 Å/min. | 13 |

Figure 2I:
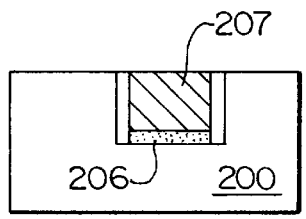

Finally, tungsten (W) is deposited by CVD within groove 210 to form an interconnect 207 as shown in FIG. 2I. For example, according to one embodiment of the present invention, a combination of $WF_6$ and $SiH_4$ or $H_2$ or both is used to deposit the tungsten in groove 210. These gases are used separately or diluted with an inert gas. The deposition pressure depends upon the gas conditions, and the deposition temperature is preferably below 350° C.

Notably, other suitable materials such as aluminum or copper may be deposited in groove 210 to form the interconnect. It is preferable to use a material having a deposition selectivity of a metal as compared to the selectivity of an insulator.

Figure 3:
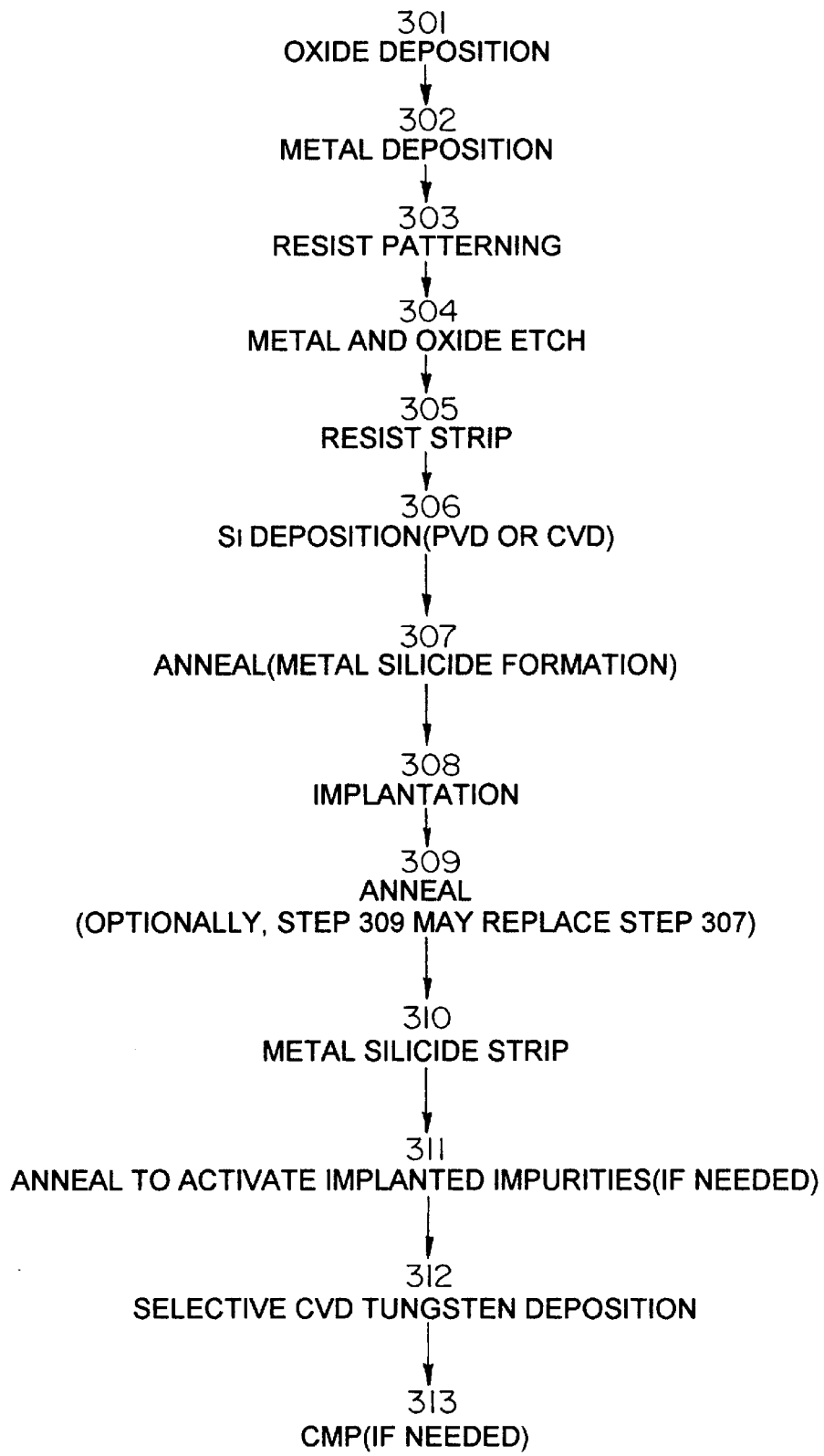
FIG. 3 provides a block diagram of the sequential steps of the interconnect fabrication method of FIGS. 2A through 2I.

The detailed process flow for the fabrication method illustrated in FIGS. 2A through 2I is illustrated in FIG. 3. The method steps are as follows:

301—a insulating layer 200 such as silicon dioxide is deposited on a semiconductor substrate (not shown);

302—a metal layer 201 is deposited on the insulating layer 200;

303—a photoresist 202 is deposited on the metal layer 201 and then patterned;

304—the metal and insulating layers 200 and 201 are etched, for example, using RIE, to form an insulator groove 210;

305—the remaining photoresist 202 is then stripped from the upper surface of the metal layer 201;

306—a silicon layer 203 is deposited over the entire region, including the upper surface of the metal layer 201 and the sidewalls and bottom of the insulator groove 210;

307—the silicon layer 203 may optionally be annealed to form a silicide 204 with the underlying metal layer 201;

308—ions 205 (e.g., arsenic or phosphorous ions) are implanted in the bottom of the insulator groove 210;

309—annealing is performed to complete formation of the silicide 204;

310—the metal silicide 204 and any remaining metal 201 is stripped, and precleaning may be performed if necessary;

311—an additional annealing step may be performed to activate the impurities 205 (the implanted ions);

312—tungsten or another appropriate interconnect material 207 is deposited into the groove 210 using selective CVD;

313—CMP is performed if necessary, for example, to remove tungsten particles accidentally grown on the insulating film 200.

Figure 4:
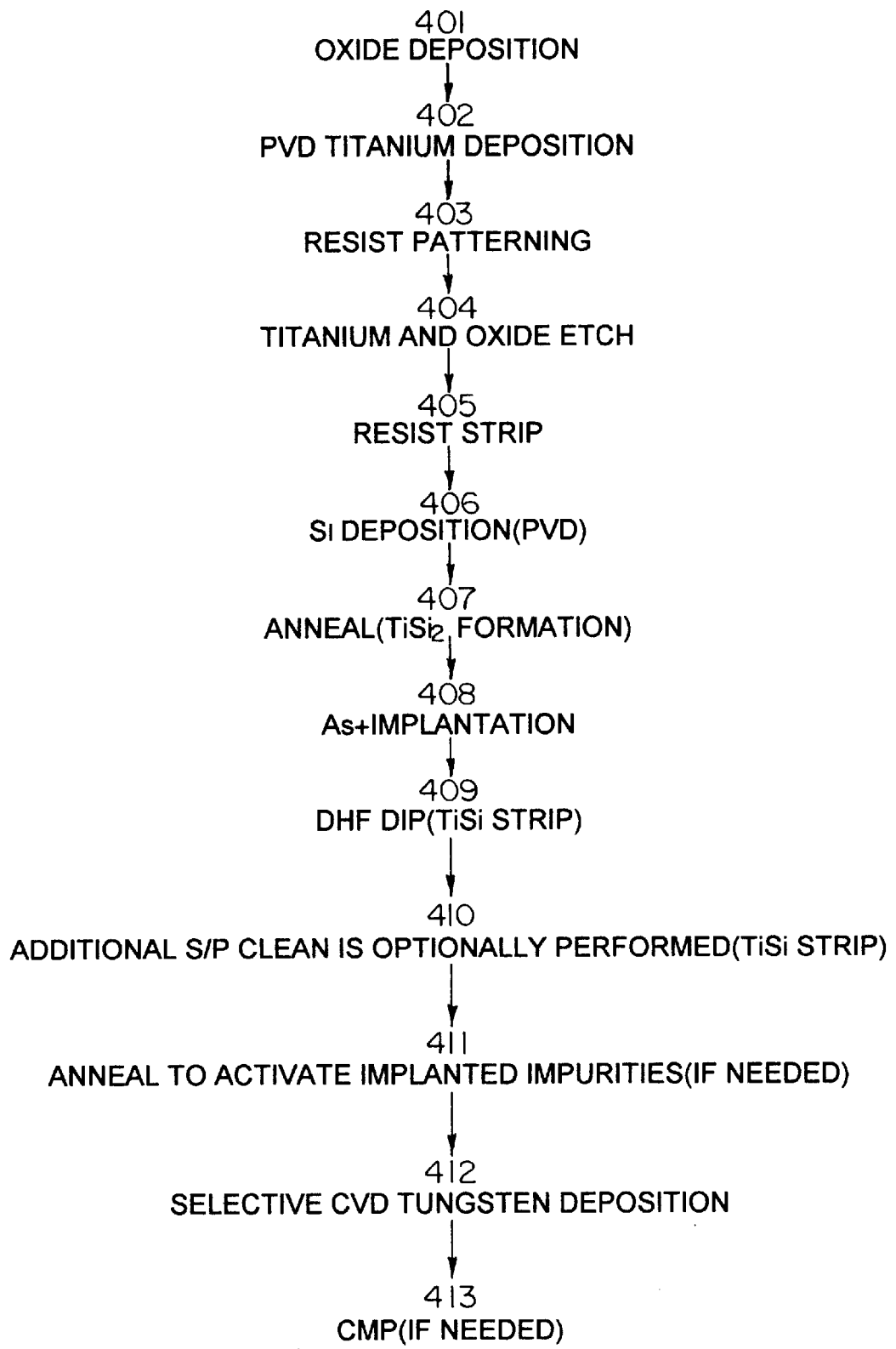
FIG. 4 provides a block diagram of the sequential steps of a second interconnect fabrication method according to the present invention.

FIG. 4 provides a flow diagram of a method according to the present invention in which titanium (Ti) is used as the metal layer and arsenic (As) is used as the implanted impurity. The steps of this method are as follows:

401—an insulating film, for example, a silicon dioxide film, is deposited on a silicon substrate;

402—a Ti layer is deposited on the upper surface of the insulating film using PVD;

403—a photoresist is deposited on the upper surface of the Ti layer and then patterned;

404—the Ti layer and the insulating film are etched using RIE to form an insulator groove;

405—the remaining photoresist is stripped from the upper surface of the Ti layer;

406—a silicon layer is deposited over the entire structure (the upper surface of the Ti layer and the sidewalls and bottom of the groove) by PVD;

407—annealing is performed as described above with reference to FIG. 2E to form a $TiSi_2$ layer;

408—arsenic ions are implanted in the bottom of the groove as described above with reference to FIG. 2F;

409—a conventional DHF dip is performed to strip off the $TiSi_2$ layer;

410—an additional S/P clean (an etching process in which a combination of sulfuric acid (S) and phosphoric acid (P) is used to remove Ti) is optionally performed if needed to strip off the remaining Ti;

411—an additional annealing step may be performed to activate the arsenic;

412—tungsten is deposited in the groove using selective CVD as described above with reference to FIG. 2I;

413—CMP is performed if needed.

Notably, the process of FIG. 4 may also be used to fabricate dual damascene interconnect formations. Additionally, the fabrication method according to the present invention may be used as a hole filling technique.

While the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A method for fabricating a damascene interconnect, the method comprising the steps of:
   depositing a metal layer on a surface of an insulating layer which is formed on an underlying substrate;
   etching said metal layer and said insulating layer to form a groove that extends into said insulating layer through said metal layer such that said groove has sidewalls and a bottom, a surface of said sidewalls and said bottom being formed by said metal layer and said insulating layer;
   depositing a silicon layer on an upper surface of said metal layer and directly on said surface of said sidewalls and said bottom of said groove;
   performing an annealing such that said silicon layer and said metal layer react to form a silicide layer;
   implanting ions into a portion of said silicon layer which is on the bottom of said groove;
   selectively etching said silicide layer; and
   depositing an interconnect material in said groove.

2. A method according to claim 1, wherein said insulating layer comprises a silicon dioxide layer.

3. A method according to claim 1, wherein said step of etching said metal layer and said insulating layer is performed using reactive ion etching.

4. A method according to claim 3, further including the step of depositing and patterning a photoresist on the upper surface of said metal layer prior to the step of etching said metal layer and said insulating film.

5. A method according to claim 1, wherein said ions are arsenic ions.

6. A method according to claim 1, wherein said ions are phosphorus ions.

7. A method according to claim 1, further comprising the step of annealing said ions after the step of implanting.

8. A method according to claim 1, wherein said interconnect material is tungsten.

9. A method according to claim 1, further comprising the step of performing chemical mechanical polishing of said interconnect material.

10. A method according to claim 1, wherein said metal layer comprises a titanium layer.

11. A method according to claim 1, wherein the step of depositing an interconnect material in said groove is performed by selective chemical vapor deposition.

12. A method according to claim 1, wherein the step of selectively etching said silicide layer is performed using one of an HF solution and a buffered HF solution.

13. A method according to claim 1, wherein a ratio of a thickness of said metal layer to a thickness of said silicon layer is greater than 0.4.

14. A method of forming an interconnect, the method comprising the steps of:
   forming a metal layer on an upper surface of an insulating layer which is formed on an underlying body of material;
   etching said metal layer on the upper surface of said insulating layer to form a groove having sidewalls and a bottom formed by said metal layer and said insulating layer;
   forming a silicon layer on an upper surface of said metal layer and on said sidewalls and said bottom of said groove;
   reacting at least a portion of said metal layer and a portion of said silicon layer which is on the upper surface of said metal layer to form a silicide layer;
   selectively etching said silicide layer; and
   depositing an interconnect material in said groove on a portion of said silicon layer which is on said sidewalls and said bottom of said groove.

15. A method according to claim 14, wherein said body of material comprises a silicon substrate.

16. A method according to claim 14, wherein said metal layer comprises a titanium layer.

17. A method according to claim 14, wherein said interconnect material comprises a material selected from the group consisting of tungsten, aluminum, and copper.

18. A method according to claim 14, wherein a ratio of a thickness of said metal layer and a thickness of said silicon layer is greater than 0.4.

19. A method of forming an interconnect, the method comprising the steps of:
   forming a metal layer on an upper surface of an insulating layer which is formed on an underlying body of material;
   etching said metal layer and said insulating layer to form a groove that extends into said insulating layer through said metal layer such that said groove has sidewalls and a bottom formed by said metal layer and said insulating layer;
   forming a silicon layer on an upper surface of said metal layer and directly on a surface of said sidewalls and said bottom of said groove;
   reacting a least a portion of said metal layer and a portion of said silicon layer which is on the upper surface of said metal layer to form a silicide layer;

selectively etching said silicide layer; and depositing an interconnect material in said groove on a portion of said silicon layer which is on said sidewalls and said bottom of said groove.

20. The method according to claim 19, wherein said body of material comprises a silicon substrate.

21. The method according to claim 19, wherein said metal layer comprises a titanium layer.

22. The method according to claim 19, wherein said interconnect material comprises a material selected from the group consisting of tungsten, aluminum, and copper.

23. The method according to claim 19, wherein a ratio of a thickness of said metal layer and a thickness of said silicon layer is greater than 0.4.

* * * * *